United States Patent
Ouyang et al.

(10) Patent No.: US 11,519,064 B1
(45) Date of Patent: Dec. 6, 2022

(54) TITANIUM ALUMINIDE COATING CAPABLE OF IMPROVING HIGH-TEMPERATURE OXIDATION RESISTANCE OF TITANIUM ALLOY AND PREPARATION METHOD THEREOF

(71) Applicant: NORTH CHINA UNIVERSITY OF TECHNOLOGY, Beijing (CN)

(72) Inventors: Peixuan Ouyang, Beijing (CN); Shuting Zhang, Beijing (CN); Wei Sun, Beijing (CN); Jinhe Yang, Beijing (CN); Zhichao Dong, Beijing (CN); Hang Li, Beijing (CN); Lu Liu, Beijing (CN); Yi Wen, Beijing (CN); Cong Liu, Beijing (CN); Yan Wu, Beijing (CN)

(73) Assignee: NORTH CHINA UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 17/730,190

(22) Filed: Apr. 27, 2022

(30) Foreign Application Priority Data

Aug. 17, 2021 (CN) .......................... 202110941624.3

(51) Int. Cl.
  *B22F 7/02* (2006.01)
  *C23C 14/14* (2006.01)
  (Continued)

(52) U.S. Cl.
  CPC .............. *C23C 14/14* (2013.01); *B22F 3/15* (2013.01); *C22C 14/00* (2013.01); *C23C 14/352* (2013.01);
  (Continued)

(58) Field of Classification Search
  None
  See application file for complete search history.

(56) References Cited

U.S. PATENT DOCUMENTS

2015/0240343 A1* 8/2015 Medvedovski ......... C23C 10/48
                                                                    428/336
2017/0095858 A1* 4/2017 Stankowski ........ C23C 14/0641
2018/0202024 A1* 7/2018 Feng ........................ B01D 3/10

FOREIGN PATENT DOCUMENTS

CN           113652644 A   *  11/2021

OTHER PUBLICATIONS

CNIPA, Notification of a First Office Action for CN202110941624.3, dated Jan. 7, 2022.

(Continued)

*Primary Examiner* — Seth Dumbris
(74) *Attorney, Agent, or Firm* — Hemisphere Law, PLLC; Zhigang Ma

(57) ABSTRACT

A titanium aluminide (TiAl) coating capable of improving high-temperature oxidation resistance of titanium alloys and a preparation method thereof are provided. The TiAl coating includes $\alpha\text{-}AlF_3$ nanoparticles, and a content of the $\alpha\text{-}AlF_3$ nanoparticles is 5-30 vol. % of the TiAl coating. The preparation method of the TiAl coating includes: using a TiAl alloy target and an $\alpha\text{-}AlF_3$ target as raw materials, and performing magnetron sputtering on a substrate surface to prepare a coating; the magnetron sputtering is double-target co-sputtering, and a substrate temperature during the magnetron sputtering is 150° C., the TiAl alloy target is performed direct current sputtering with a power of 0.5-2 kW, and the $\alpha\text{-}AlF_3$ target is performed radio frequency sputtering with a power of 0.07-0.2 kW. After the coating is obtained by the double-target co-sputtering, the obtained coating is heat-treated at 600-800° C. for 5-20 h to obtain a final coating.

10 Claims, 2 Drawing Sheets

(51) Int. Cl.
*C22C 14/00* (2006.01)
*C23C 14/35* (2006.01)
*B22F 3/15* (2006.01)
*C23C 14/58* (2006.01)

(52) U.S. Cl.
CPC .... *C23C 14/5806* (2013.01); *B22F 2301/052* (2013.01); *B22F 2301/205* (2013.01); *B22F 2302/45* (2013.01); *Y10T 428/12139* (2015.01)

(56) References Cited

OTHER PUBLICATIONS

North China University of Technology (Applicant), Reply to Notification of a First Office Action for CN202110941624.3 w/ Replacement Claims, dated Jan. 14, 2022.
North China University of Technology (Applicant), Preliminary amendments and allowable claims for CN202110941624.3, dated Jan. 26, 2022.
CNIPA, Notification to grant patent right for invention for CN202110941624.3, dated Mar. 2, 2022.

\* cited by examiner

TITANIUM ALUMINIDE COATING CAPABLE OF IMPROVING HIGH-TEMPERATURE OXIDATION RESISTANCE OF TITANIUM ALLOY AND PREPARATION METHOD THEREOF

CROSS-REFERENCE TO RELATED APPLICATION

This application claims priority to Chinese Patent Application No. 2021109416243, filed on Aug. 17, 2021, the contents of which are hereby incorporated by reference.

TECHNICAL FIELD

The disclosure belongs to the field of titanium alloy high-temperature protection technologies, and particularly relates to a titanium aluminide (TiAl) coating capable of improving the high-temperature oxidation resistance of titanium alloy and a preparation method thereof.

BACKGROUND

High-temperature oxidation resistance is an important challenge for titanium alloy components to maintain long-term stable service in aero-engines. At present, 600 Celsius degrees (° C.) is still the ultimate service temperature of solution strengthened titanium alloy. A TiAl coating has an important application prospect in anti-oxidation protection of titanium alloy surface because of its similar composition and small difference in thermal expansion coefficient. However, with the new generation of aero-engine power system index becoming extreme, the high-temperature oxidation resistance of the TiAl coating needs to be further improved.

Increasing the Al content is one of the conventional methods to improve the oxidation resistance of the TiAl coating, but for TiAl binary coatings, the critical Al content required for oxidation to form protective α-aluminide oxide ($\alpha$-$Al_2O_3$) films is as high as 60-70 atomic percent (at. %), in this case the coating is dominated by the brittle $TiAl_2$ and $TiAl_3$ phases, which tend to form penetrating cracks in the coating, thereby accelerating coating flaking and reducing coating service life. Therefore, researchers have introduced a third group of metallic elements such as chromium (Cr), niobium (Nb) and silicon (Si) and non-metallic elements such as chlorine (Cl), phosphorus (P) and fluorine (F) into TiAl coatings with low Al content to increase the Al activity, so as to improve the oxidation resistance of TiAl coatings and safeguarding their mechanical properties. Among the coatings with the nonmetallic elements mentioned above, F-modified TiAl coatings have received a lot of attention from scholars at home and abroad. These coatings are obtained by diffusion infiltration of Al or magnetron sputtering to produce TiAl binary coatings on the surface of titanium alloys, and then infiltrating F atoms using methods such as plasma immersion ion implantation or liquid phase spraying of fluorine-containing organic substances. Compared to TiAl coatings modified with other elements, F-modified TiAl coatings have the following advantages: low density, and at high temperatures (>600° C.) solid-solution F atoms in the coating form gas-phase AlF by combining with Al atoms, replacing conventional solid-phase Al atoms as the aluminium source carrier, significantly increasing the diffusion rate and activity of Al, and reducing the critical Al content required for the coating to maintain protective oxide film growth to 40 at. %. However, the shortcoming of this coating is that during the warming process (400-600° C.) the solid solution F atoms tend to combine with Ti atoms to form volatile $TiF_4$, resulting in a significant reduction in the remaining F content (maximum F content reduced from 28 at. % to 2 at. %), thus limiting the maximum activation effect of F on Al and affecting the improvement of the oxidation resistance. Therefore, it is of great significance to explore for a TiAl coating preparation technology that reduces F loss and can significantly improve the oxidation resistance of titanium alloys.

SUMMARY

The purpose of the present disclosure is to provide a different TiAl coating and its preparation method, aiming at the problem that Al activation is limited due to the easy combination of solid solution F atoms with Ti in F-modified TiAl coating. Specifically, it includes an $\alpha$-$AlF_3$ nano-particle modified TiAl coating and its double-target magnetron sputtering deposition technology, in which $\alpha$-$AlF_3$ nano-particles replace solid solution F atoms as fluorine source, and the obtained coating still has excellent oxidation resistance of titanium alloy substrate at 670° C.

One of the technical solutions of the disclosure is a TiAl coating which can improve the high-temperature oxidation resistance of titanium alloys. The TiAl coating includes $\alpha$-$AlF_3$ nanoparticles, and a content of the $\alpha$-$AlF_3$ nanoparticles is 5-30 volume percent (vol. %) of that of the TiAl coating.

In an embodiment, a thickness of the TiAl coating is in a range of 2-15 micrometre (μm).

When the TiAl coating capable of improving the high-temperature oxidation resistance of titanium alloys is subjected to a constant-temperature oxidation test at 670° C. for 500 hours (h), the oxidation weight gain of the coating does not exceed 0.1 milligram per square centimeters ($mg/cm^2$).

The second technical solution of the present disclosure provides a preparation method of the TiAl coating which can improve the high-temperature oxidation resistance of titanium alloys, including the following steps: performing magnetron sputtering on a substrate surface by using a TiAl alloy target and a $\alpha$-$AlF_3$ target as raw materials to prepare a coating.

In an embodiment, the preparation method of the TiAl alloy target includes the following steps: uniformly mixing a Ti powder and an Al powder to obtain a mixture powder, and then performing hot isostatic pressing on the mixture powder to obtain the TiAl alloy target; the preparation method of the $\alpha$-$AlF_3$ target includes the following steps: performing hot isostatic pressing on an $\alpha$-$AlF_3$ ceramic powder to obtain the $\alpha$-$AlF_3$ target.

In an embodiment, each of the particle sizes of the Ti powder and the Al powder is in a range of 1-50 the amount of the Al powder is 35-45 at. % of the total amount of the Ti powder and the Al powder, and the purity of the $\alpha$-$AlF_3$ ceramic powder is greater than 99.99 percent (%).

In an embodiment, the particle size of the Ti powder is preferably 44 and the particle size of the Al powder is preferably 37 μm.

In an embodiment, the specific operation of the uniformly mixing a Ti powder and an Al powder is to mix the Ti powder and the Al powder at the rotating speed of 80-150 revolutions per minute (r/min) for 4-10 h; the holding pressure temperature of the hot isostatic pressing of the mixture powder is in a range of 1100-1300° C., the isostatic pressure of the hot isostatic pressing of the mixture powder is in a range of 130-190 megapascals (MPa), and the holding temperature and pressure time of the hot isostatic pressing of the mixture power is in a range of 2-6 h.

In an embodiment, a holding pressure temperature of the hot isostatic pressing of the α-AlF$_3$ ceramic powder is in a range of 1700-1800° C., an isostatic pressure of the hot isostatic pressing of the α-AlF$_3$ ceramic powder is in a range of 130-190 MPa, and a holding temperature and pressure time of the hot isostatic pressing of the α-AlF$_3$ ceramic powder is in a range of 1-5 h.

In an embodiment, a titanium alloy substrate is a Ti60 titanium alloy substrate after surface pretreatment. The specific operation of the surface pretreatment is as follows: grinding with 800#, 1500# sandpaper in sequence, and then ultrasonic cleaning with acetone and alcohol in sequence and then drying.

In an embodiment, the magnetron sputtering is double-target co-sputtering, the substrate temperature during the magnetron sputtering is 150° C., the TiAl alloy target is performed direct current (DC) sputtering with the power of 0.5-2 kilowatts (kW), and the α-AlF$_3$ target is performed radio frequency (RF) sputtering with the power of 0.07-0.2 kW.

In an embodiment, the sputtering time of the double-target co-sputtering is in a range of 8-20 h, and the double-target co-sputtering is performed under the environment of argon (Ar) gas pressure of 0.5-3 pascals (Pa).

In an embodiment, after the coating is prepared by the double-target co-sputtering, the method further includes a coating post-treatment, which specifically includes performing a heat treatment on the coating prepared by the double-target co-sputtering at 600-800° C. for 5-20 h.

In an embodiment, a vacuum pumping operation is performed before the heat treatment, and the vacuum is pumped to the air pressure of 0.05 Pa.

In an embodiment, the preparation process flow of the TiAl coating which can improve the high-temperature oxidation resistance of the titanium alloys is shown in FIG. 1.

Compared with the prior art, the disclosure has the following beneficial effects:

(1) The present disclosure obtains a new TiAl coating modified by nano-α-AlF$_3$ particles on the surface of titanium alloy through the double-target magnetron co-sputtering technique, the element F in the coating exists in the form of α-AlF$_3$ nanoparticles, which solves the problem of restricting the maximum activation effect of F on Al due to the easy reaction of active solid solution F atom with Ti in the prior art. The heat treatment operation after the double-target magnetron co-sputtering deposition eliminates the thermal stress generated during the preparation of the coating, and enables Al and Ti elements to diffuse into each other at the coating-substrate interface to form a metallurgical bond, which improves the interfacial bonding force. The oxidation weight gain of the coating does not exceed 0.1 mg/cm$^2$ during 500 h constant temperature oxidation test at 670° C., and the coating has good oxidation resistance. The coating adheres to the surface of the titanium alloy substrate so that the titanium alloy substrate still has excellent oxidation resistance at 670° C. The coating can be used for high temperature protection of titanium alloy components of aero-engines. The preparation method of the present disclosure can achieve the simultaneous construction of TiAl coating and fluorine source in one step, and the method is simple and efficient.

(2) Before magnetron sputtering of the titanium alloy substrate, the surface of the titanium alloy substrate is polished with 800# and 1500# sandpaper in sequence, followed by drying after ultrasonic cleaning with acetone and alcohol in sequence, which removes impurities from the surface of the titanium alloy substrate, makes the surface of the titanium alloy substrate smooth and flat with good adhesion to the deposited coating, and improves the bonding strength of the coating.

(3) In this disclosure, the dual-target co-sputtering method is used for the sputtering of the coating, with DC sputtering for the TiAl alloy target and RF sputtering for the α-AlF$_3$ target. DC sputtering is suitable for conductor targets such as metals and alloys, and its deposition rate is larger; while RF sputtering is suitable for metal conductors, semiconductors and insulators, but its deposition rate is smaller; the TiAl alloy is a conductor and the α-AlF$_3$ is an insulator, and the content of the α-AlF$_3$ in the coating is relatively small, so the TiAl target is sputtered by DC and the AlF$_3$ is sputtered by RF. The power level of both affects the respective deposition rates and therefore the amount of α-AlF$_3$ in the composite coating. In the composite coating, the amount of α-AlF$_3$ nanoparticles affects the properties of the coating, if the nanoparticle content is too low, it is difficult to react with TiAl to generate enough gas phase AlF for further oxidation to form alumina, and the oxidation resistance of the coating cannot be effectively improved; if the nanoparticle content is too high, it is easy to form a large amount of gas phase AlF quickly, leading to coating instability, and the high nanoparticle content deteriorates the mechanical properties of the coating. By controlling the type and power of the magnetron sputtering of the target, the disclosure obtains a better content range of α-AlF$_3$ nanoparticles and yields a coating with excellent properties.

(4) In the preparation process of the disclosure, the particle size of Ti and Al powder, the purity of α-AlF$_3$ ceramic powder, the parameters of hot isostatic pressure and other conditions will also have certain influence on the performance of the coating. The particle sizes of Ti and Al powders will affect the density and grain size of the TiAl target, and then affect the deposition quality (with or without defects) and grain size of the coating. The purity of the α-AlF$_3$ ceramic powder affects the deposition quality of the coating, if there are more impurities, it is not easy to deposit uniformly, and the denseness of the coating obtained is not good; the hot isostatic pressure parameters directly affect the denseness and grain size of the target, which further affects the deposition quality and microstructure of the coating. In the present disclosure, the optimum ranges of parameters for Ti and Al powder particle size, α-AlF$_3$ ceramic powder purity and hot isostatic pressing were obtained through several tests and combined with the substrate pretreatment, magnetron sputtering process and high temperature heat treatment to obtain coatings with excellent oxidation resistance by synergistically adjusting the parameters of all the above processes.

BRIEF DESCRIPTION OF THE DRAWINGS

In order to more clearly explain the embodiments of the present disclosure or the technical solutions in the prior art, the drawings needed in the embodiments will be briefly introduced below. Obviously, the drawings in the following description are only some embodiments of the present disclosure, and for those skilled in the art, other drawings could be obtained according to these drawings without paying creative efforts.

DETAILED DESCRIPTION OF THE EMBODIMENTS

Figure 1:
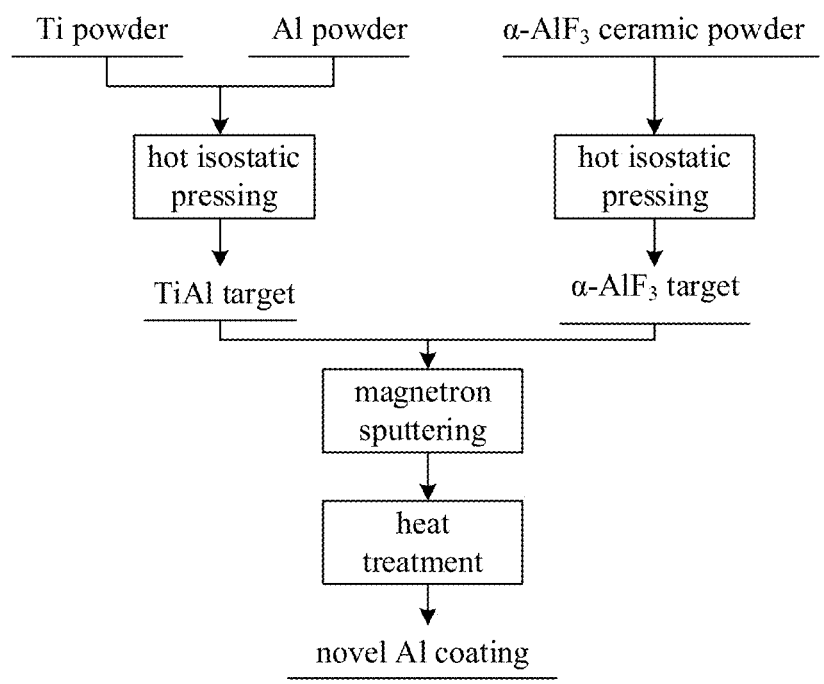
FIG. 1 illustrates a process flow diagram for the preparation method of a TiAl coating to improve the high-temperature oxidation resistance of titanium alloys.

Now various exemplary embodiments of the present disclosure will be described in detail. This detailed description should not be considered as a limitation of the present disclosure, but should be understood as a more detailed description of some aspects, characteristics and embodiments of the present disclosure.

It should be understood that the terms used in this disclosure are only for describing specific embodiments, and are not used to limit the disclosure. In addition, for the numerical range in the present disclosure, it should be understood that each intermediate value between the upper limit and the lower limit of the range is also specifically disclosed. Any stated value or intermediate value within the stated range and any other stated value or every smaller range between intermediate values within the stated range are also included in the present disclosure. The upper and lower limits of these smaller ranges could be independently included or excluded from the range.

Unless otherwise specified, all technical and scientific terms used herein have the same meaning as commonly understood by the those skilled in the art of this disclosure. Although the present disclosure only describes the preferred methods and materials, any methods and materials similar or equivalent to those described herein could also be used in the practice or testing of the present disclosure. All documents mentioned in this specification are incorporated by reference to disclose and describe the methods and/or materials related to the documents. In case of conflict with any incorporated documents, the contents of this specification shall prevail.

Without departing from the scope or spirit of the present disclosure, it is obvious to those skilled in the art that modifications and changes could be made to the specific embodiments of the present disclosure. Other embodiments obtained from the description of the present disclosure will be obvious to those skilled in the art. The description and embodiments of the present disclosure are exemplary only.

The terms "including", "comprising", "having", "containing" and so on used in this description are all open-ended terms, which mean including but not limited to.

Embodiment 1

(1) Preparation of the target material:

The alloy is prepared according to the following components: Al: 40 at. %; Ti: the balance (the particle size is 44 μm), the above powders are mixed in a ball milling tank at a speed of 110 r/min for 6 h, and then pressed into the TiAl target of ϕ20×3 mm³ by the hot isostatic pressing machine, with the pressure holding temperature of 1250° C., the isostatic pressure of 160 MPa and the holding pressure and temperature time of 3 h. Drying and pressing high purity α-$AlF_3$ ceramic powder (particle size 37 μm) into α-$AlF_3$ target with ϕ20×3 mm³ by the hot isostatic pressing machine, with the pressure holding temperature of 1750° C., the hot isostatic pressing pressure of 160 MPa, and the holding pressure and temperature time of 2 h.

(2) Coating Preparation:

Installing the TiAl target and the α-$AlF_3$ target on the magnetron coater, installing the Ti60 titanium alloy substrate after the surface pre-treatment (sanding with 800# and 1500# sandpaper in sequence, followed by ultrasonic cleaning with acetone and alcohol and then drying), adjusting the target-base distance to 12 centimetres (cm); using the mechanical pump and diffusion pump to pump the background vacuum to $1 \times 10^{-4}$ Pa; heating the substrate to 150° C.; turning on the flow meter and introducing argon gas to achieve a working pressure of 0.7 Pa; turning on the direct current (DC) and radio frequency (RF) power supplies corresponding to the TiAl and α-$AlF_3$ targets respectively, with powers of 1.0 kW and 0.12 kW respectively, and sputtering for 10 h; keeping the vacuum chamber under vacuum until cooling down to a room temperature and taking out the sample.

(3) Coating Post-Treatment:

Putting the sample in a high-temperature vacuum furnace, vacuumizing until the air pressure is 0.05 Pa, raising the temperature to 650° C., keeping the temperature for 15 h, and then cooling to the room temperature with the furnace to obtain a new TiAl coating.

The thickness of the TiAl coating is measured to be 12.3 μm.

The standard Gibbs reaction free energies between $AlF_3$ and Al atoms and Ti atoms in the coating are calculated, and drawing the curve. The specific method is as follows:

Determining the chemical reaction equations of $AlF_3$ with Al and Ti atoms as $AlF_3(s)+2Al(s)=3AlF(g)$ and $4AlF_3(s)+3Ti(s)=3TiF_4(g)+4Al(s)$ respectively. Then finding the specific heat capacity, phase transition heat capacity and enthalpy and entropy of formation at 298K of each reactant and product in *Practical Inorganic Thermodynamic Data Manual*. Then calculating the reaction enthalpy and entropy at 298K according to the chemical reaction equation, and the functional relations between specific heat capacity and temperature of phase transition is considered. Finally, the Gibbs free energy changing with temperature is obtained according to the relationship between Gibbs free energy and specific heat capacity, temperature, enthalpy and entropy at 298 K.

Figure 2:
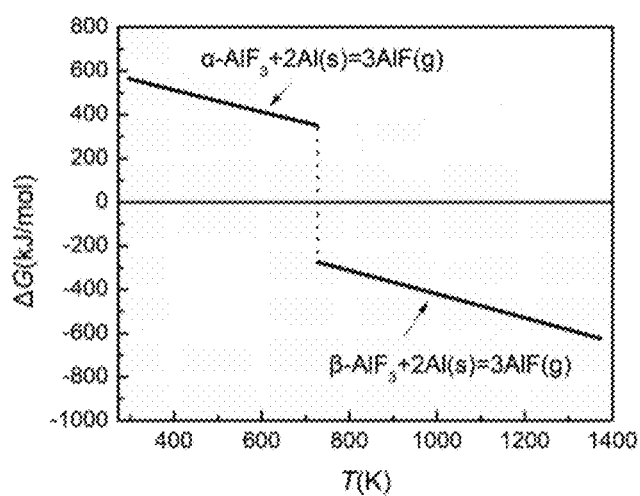
FIG. 2 illustrates a standard Gibbs reaction free energy curve of $AlF_3$ with Al atoms in the coating.
Figure 3:
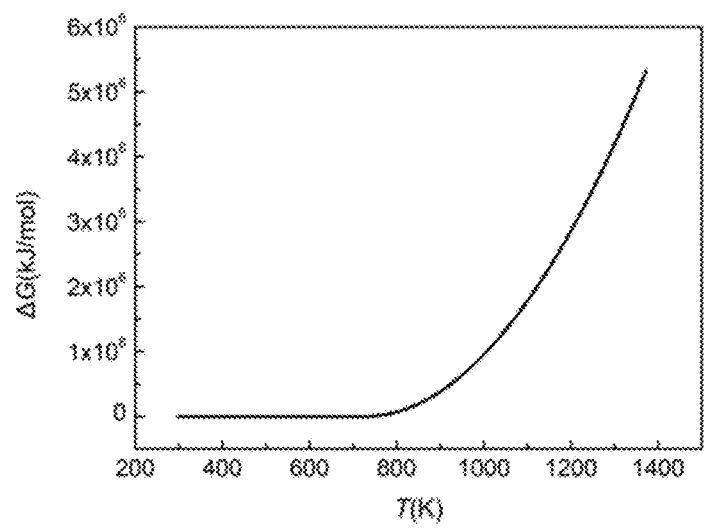
FIG. 3 illustrates a standard Gibbs reaction free energy curve of $AlF_3$ with Ti atoms in the coating.

The obtained standard Gibbs reaction free energy curve of $AlF_3$ and Al atoms in the coating is shown in FIG. 2, and the standard Gibbs reaction free energy curve of $AlF_3$ and Ti atoms in the coating is shown in FIG. 3.

Thermodynamic results show that α-$AlF_3$ will be transformed into β-$AlF_3$ when heated above 454° C., and the latter could combine with Al atoms to form gaseous AlF aluminum source carrier, which significantly improves the activity of Al (see FIG. 2). And both α-$AlF_3$ and β-$AlF_3$ do not react with Ti (see FIG. 3), so that F could exert the maximum activation effect on Al, thus significantly improving the oxidation resistance of the coating. Therefore, using stable α-$AlF_3$ nanoparticles instead of solid solution F atoms as fluorine source is an effective measure to overcome the limited activation degree of Al in F-modified TiAl coating and improve the oxidation resistance.

Figure 4:
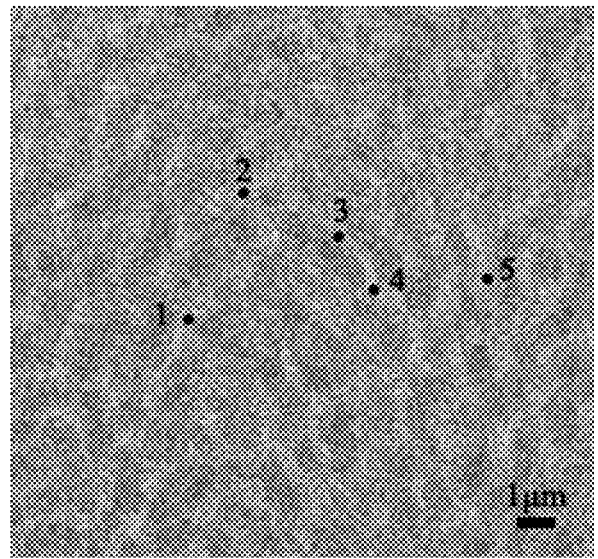
FIG. 4 illustrates a scanning transmission electron microscope analysis diagram of the coating prepared in Embodiment 1.

Analyzing the distribution of $AlF_3$ in the coating using scanning-transmission electron microscopy as shown in FIG. 4. The results of the EDS analysis of the locations marked in FIG. 4 are shown in TBL 1.

TABLE 1

| Position | Composition/at.% | | |
|---|---|---|---|
| | Al | Ti | F |
| 1 | 23.61 | 5.32 | 71.07 |
| 2 | 22.69 | 6.07 | 71.24 |
| 3 | 23.97 | 5.09 | 70.94 |
| 4 | 24.03 | 5.54 | 70.43 |
| 5 | 22.54 | 4.93 | 72.53 |

As can be seen from the table above, F is mainly present in the form of AlF$_3$ compounds (with an atomic ratio of Al to F of approximately 1:3), distributed at the TiAl grain boundaries. The Al content of the matrix phase in the coating is about 38.6 at. %. The AlF$_3$ nanoparticle content is calculated to be approximately 18.0 vol. % according to image processing techniques (the conversion gives an F atomic content of 8.3 at. % in the coating, the conversion formula is as follows:

$$F(\text{at. \%}) = \frac{3n_{AlF_3}}{4n_{AlF_3} + 2n_{TiAl}} = \frac{\dfrac{3\rho_{AlF_3} V_{AlF_3}}{M_{AlF_3}}}{\dfrac{4\rho_{AlF_3} V_{AlF_3}}{M_{AlF_3}} + \dfrac{2\rho_{TiA} V_{TiA}}{M_{TiA}}} = \frac{0.051x}{0.12 - 0.052x},$$

x is the volume content of AlF$_3$ particles). Coating the surface of the sample except the coating with anti-high temperature oxidation coating, drying and weighing the sample, then putting the sample in a high temperature tube furnace, keeping the temperature at 670° C. for 500 h, and then air-cooling to the room temperature. Observing that the surface of the sample is intact without peeling off, and the weight gain per unit area of the coating obtained by weighing is 0.08 mg/cm$^2$.

Embodiment 2

Embodiment 2 is the same as Embodiment 1, except that the power supply power of the α-AlF$_3$ target is 0.18 kW.

The measured thickness of the coating is 12.4 µm, and the content of the matrix phase Al in the coating is about 38.7 at. %, and the content of AlF$_3$ nanoparticles is about 25.4 vol. % (the converted F atom content is 12.1 at. %). Coating the surface of the sample except the coating with anti-high temperature oxidation coating, drying, weighing the sample, and putting the sample in a high temperature tube furnace, keeping the temperature at 670° C. for 500 h, and then air-cooling to the room temperature. Observing the sample, the coating does not peel off, and the weight gain per unit area of the coating is 0.05 mg/cm$^2$.

Embodiment 3

The same as Embodiment 1, except that the power supply of the TiAl target is 0.6 kW.

The measured thickness of the coating is 7.3 µm, and content of matrix phase Al in the coating is about 38.4 at. %, and the content of AlF$_3$ nanoparticles is about 28.4 vol. %. Coating the surface of the sample except the coating with anti-high temperature oxidation coating, drying, weighing the sample, and putting the sample in a high temperature tube furnace, keeping the temperature at 670° C. for 500 h, and then air-cooling to the room temperature. The sample is observed the coating does not peel off, and the weight gain per unit area of the coating is 0.09 mg/cm$^2$.

Embodiment 4

The same as Embodiment 1, except that the ingredients of the TiAl target are Al: 43 at. % and Ti: the balance.

The measured thickness of the coating is 12.3 µm, and the content of the matrix phase Al in the coating is about 41.2 at. %, and the content of the AlF$_3$ nanoparticles is about 18.1 vol. %. Coating the surface of the sample except the coating with anti-high temperature oxidation coating, drying, weighing the sample, and putting the sample in a high temperature tube furnace, keeping the temperature at 670° C. for 500 h, and then air-cooling to the room temperature. Observing the sample, the coating does not peel off, and the weight gain per unit area of the coating is 0.06 mg/cm$^2$.

Comparative Embodiment 1

Comparative embodiment is the same as Embodiment 3, except that both the TiAl target and the α-AlF$_3$ target use RF power supply.

The measured thickness of the coating is 1.2 µm, and content of matrix phase Al in the coating is about 38.3 at. %, and the content of the AlF$_3$ nanoparticles is about 47.5 vol. %. Coating the surface of the sample except the coating with anti-high temperature oxidation coating, drying, weighing the sample, and putting the sample in a high temperature tube furnace, keeping the temperature at 670° C. for 500 h, and then air-cooling to the room temperature. Observing the sample, and finding that there is local cracking inside the coating, and the weight gain per unit area of the coating is 3.1 mg/cm$^2$.

Comparative Embodiment 2

Comparative embodiment 2 is the same as Embodiment 1, except that the ingredients of the TiAl target are Al: 28 at. % and Ti: the balance.

The measured thickness of the coating is 12.3 µm, and the content of matrix phase Al in the coating is about 27.0 at. %, and the content of AlF$_3$ nanoparticles is about 18.2 vol. %. Coating the surface of the sample except the coating with high-temperature oxidation resistant coating, drying, weighing, placing the sample in a high-temperature tube furnace, keeping the temperature at 670° C. for 500 h, and then air-cooling to the room temperature. Observing the sample, the oxide skin on the coating surface is obviously peeled off, and the weight gain per unit area of the coating by weighing is 2.1 mg/cm$^2$.

Comparative Embodiment 3

Depositing a TiAl coating on the Ti60 titanium alloy substrate. The deposition process is the same as in Embodiment 1, except that only a single TiAl target is sputtered, but no AlF$_3$ target is sputtered. Using plasma immersion to inject the F atoms by a plasma injection machine. The plasma power supply is 500 W, the bias voltage is 10 kV, the gas is Ar/CH$_2$F$_2$, the working pressure is 0.5 Pa, the pulse width is 10 µs, and the F atoms are injected continuously for 5 min.

The measured thickness of the coating is 12.3 µm, the content of substrate phase Al in the coating is about 38. 7 at. %, and the content of the F atoms in the coating is about 8 at. % (basically equivalent to the content of the F atoms in Embodiment 1). Coating the surface of the sample except the coating with high-temperature oxidation resistant coating, drying, weighing, placing the sample in a high-temperature tube furnace, keeping the temperature at 670° C. for 500 h, and then air-cooling to the room temperature. Observing the sample, and finding that the oxide skin on the coating surface has obvious peeling off, and the oxidation gain per unit area of the coating 1.7 mg/cm² is obtained after weighing.

The foregoing are only preferred embodiments of the disclosure and are not intended to limit the disclosure. Any modifications, equivalent substitutions and improvements etc. made within the spirit and principles of the disclosure shall fall in the scope of protection of the disclosure.

What is claimed is:

1. A titanium aluminide (TiAl) coating capable of improving a high-temperature oxidation resistance of titanium alloys, wherein the TiAl coating comprises alpha-aluminum fluoride ($\alpha$-AlF$_3$) nanoparticles, and a content of the $\alpha$-AlF$_3$ nanoparticles is 5-30 volume percent (vol. %) of the TiAl coating; and wherein the TiAl coating is prepared by using a TiAl alloy target and an $\alpha$-AlF$_3$ target as raw materials, and a content of Al in the TiAl alloy target is 35-45 atomic percent (at. %) of a total amount of the TiAl alloy target.

2. The TiAl coating according to claim 1, wherein a thickness of the TiAl coating is in a range of 2-15 micrometres ($\mu$m).

3. A preparation method for the TiAl coating according to claim 1, comprising:

performing magnetron sputtering on a substrate surface by using the TiAl alloy target and the $\alpha$-AlF$_3$ target as the raw materials to prepare a coating.

4. The preparation method according to claim 3, wherein a preparation method of the TiAl alloy target comprises: uniformly mixing a Ti powder and an Al powder to obtain a mixture powder, and performing hot isostatic pressing on the mixture powder to obtain the TiAl alloy target; and wherein a preparation method of the $\alpha$-AlF$_3$ target comprises: performing hot isostatic pressing on an $\alpha$-AlF$_3$ ceramic powder to obtain the $\alpha$-AlF$_3$ target.

5. The preparation method according to claim 4, wherein each of particle sizes of the Ti powder and the Al powder is in a range of 1-50 $\mu$m, an amount of the Al powder is 35-45 atomic percent (at. %) of a total amount of the Ti powder and the Al powder, and a purity of the $\alpha$-AlF$_3$ ceramic powder is greater than 99.99 percent (%).

6. The preparation method according to claim 4, wherein the uniformly mixing a Ti powder and an Al powder comprises: mixing the Ti powder and the Al powder at a rotating speed of 80-150 revolutions per minute (r/min) for 4-10 hours (h); and wherein a holding pressure temperature of the hot isostatic pressing of the mixture power is in a range of 1100-1300 celsius degrees (° C.), an isostatic pressure of the hot isostatic pressing of the mixture power is in a range of 130-190 megapascals (MPa), and a holding temperature and pressure time of the hot isostatic pressing of the mixture power is in a range of 2-6 h.

7. The preparation method according to claim 4, wherein a holding pressure temperature of the hot isostatic pressing of the $\alpha$-AlF$_3$ ceramic powder is in a range of 1700-1800° C., an isostatic pressure of the hot isostatic pressing of the $\alpha$-AlF$_3$ ceramic powder is in a range of 130-190 MPa, and a holding temperature and pressure time of the hot isostatic pressing of the $\alpha$-AlF$_3$ ceramic powder is in a range of 1-5 h.

8. The preparation method according to claim 3, wherein the magnetron sputtering is double-target co-sputtering, a substrate temperature during the magnetron sputtering is 150° C., the TiAl alloy target is performed direct current (DC) sputtering with a power of 0.5-2 kW, and the $\alpha$-AlF$_3$ target is performed radio frequency (RF) sputtering with a power of 0.07-0.2 kW.

9. The preparation method according to claim 8, wherein a sputtering time of the double-target co-sputtering is in a range of 8-20 h, and the double-target co-sputtering is performed under an environment of an Argon (Ar) gas pressure of 0.5-3 Pa.

10. The preparation method according to claim 3, further comprising: a coating post-treatment comprising:

performing a heat treatment on the coating prepared by the magnetron sputtering at 600-800° C. for 5-20 h.

* * * * *